(12) United States Patent
Shao et al.

(10) Patent No.: US 12,471,314 B2
(45) Date of Patent: Nov. 11, 2025

(54) SEMICONDUCTOR STRUCTURE AND FABRICATION METHOD THEREOF

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Guangsu Shao, Hefei (CN); Deyuan Xiao, Hefei (CN); Yunsong Qiu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 660 days.

(21) Appl. No.: 17/883,565

(22) Filed: Aug. 8, 2022

(65) Prior Publication Data

US 2024/0274684 A1   Aug. 15, 2024

Related U.S. Application Data

(63) Continuation of application No. PCT/CN2022/077903, filed on Feb. 25, 2022.

(30) Foreign Application Priority Data

Aug. 6, 2021   (CN) .......................... 202110904520.5

(51) Int. Cl.
  *H10D 30/67*    (2025.01)
  *H10B 12/00*   (2023.01)
  (Continued)

(52) U.S. Cl.
  CPC ......... *H10D 30/6735* (2025.01); *H10B 12/05* (2023.02); *H10B 12/315* (2023.02);
  (Continued)

(58) Field of Classification Search
  CPC .. H10D 30/6735; H10D 30/014; H10D 30/43; H10D 30/6757; H10D 62/121;
  (Continued)

(56) References Cited

U.S. PATENT DOCUMENTS

| | | | |
|---|---|---|---|
| 2007/0082448 A1 | 4/2007 | Kim et al. | |
| 2011/0121396 A1* | 5/2011 | Lee | ........................ G11C 11/403 |
| | | | 257/E29.264 |

(Continued)

FOREIGN PATENT DOCUMENTS

| | | |
|---|---|---|
| CN | 103311249 A | 9/2013 |
| CN | 104009082 A | 8/2014 |

(Continued)

*Primary Examiner* — Yara B Green
*Assistant Examiner* — Akhee Sarker-Nag
(74) *Attorney, Agent, or Firm* — Kilpatrick Townsend & Stockton LLP

(57) ABSTRACT

Embodiments provide a semiconductor structure and a fabrication method thereof, which relate to the field of semiconductor technology. The method for fabricating a semiconductor structure includes: providing a substrate; forming a plurality of active pillars arranged in an array in the substrate; and forming a gate arranged around each of the active pillars, where a projection of the gate on the active pillar covers a channel region of the active pillar. Along a direction perpendicular to the substrate, the gate includes a first conductive layer and a second conductive layer sequentially arranged in a stack, and a work function of the first conductive layer is different from a work function of the second conductive layer.

7 Claims, 11 Drawing Sheets

(51) Int. Cl.
*H10D 30/01* (2025.01)
*H10D 30/43* (2025.01)
*H10D 62/10* (2025.01)
*H10D 64/66* (2025.01)

(52) U.S. Cl.
CPC ......... *H10B 12/482* (2023.02); *H10B 12/488* (2023.02); *H10D 30/014* (2025.01); *H10D 30/43* (2025.01); *H10D 30/6757* (2025.01); *H10D 62/121* (2025.01); *H10D 64/666* (2025.01); *H10D 64/667* (2025.01)

(58) Field of Classification Search
CPC .. H10D 64/666; H10D 64/667; H10D 30/024; H10B 12/05; H10B 12/315; H10B 12/482; H10B 12/488; H10B 12/053; H10B 12/34; H10B 12/36; H10B 12/056
See application file for complete search history.

(56) References Cited

U.S. PATENT DOCUMENTS

| | | | |
|---|---|---|---|
| 2013/0234240 A1 | 9/2013 | Moon et al. | |
| 2014/0239247 A1 | 8/2014 | Park | |
| 2016/0049446 A1* | 2/2016 | Park | H10D 64/517 257/4 |
| 2016/0300886 A1 | 10/2016 | Oh et al. | |
| 2019/0273081 A1* | 9/2019 | Moon | H10D 62/314 |
| 2021/0143068 A1 | 5/2021 | Xu et al. | |

FOREIGN PATENT DOCUMENTS

| | | |
|---|---|---|
| CN | 105518867 A | 4/2016 |
| CN | 110957319 A | 4/2020 |
| CN | 113611671 A | 11/2021 |

\* cited by examiner

| Form a plurality of first grooves spaced along a first direction in the substrate, where the first grooves extend along a second direction, an area between adjacent first grooves constitutes a n active strip, and the first direction intersects with the second direction | S210 |

| Form a spacer in each of the first grooves, where a top surface of the spacer is flush with that of the substrate | S220 |

| Form a plurality of second grooves spaced along the second direction in the substrate, where each of the second grooves extends along the first direction, a depth of the second groove is smaller than that of the first groove, and reserved part of the active strips constitutes a plurality of initial active pillars arranged in an array | S230 |

| Perform ion implantation on the initial active pillars to form the active pillars | S240 |

Fig. 3

SEMICONDUCTOR STRUCTURE AND FABRICATION METHOD THEREOF

CROSS-REFERENCE TO RELATED APPLICATION

The present disclosure is a continuation of PCT/CN2022/077903, filed on Feb. 25, 2022, which claims priority to Chinese Patent Application No. 202110904520.5 titled "SEMICONDUCTOR STRUCTURE AND FABRICATION METHOD THEREOF" and filed to the State Intellectual Property Office on Aug. 6, 2021, the entire contents of which are incorporated herein by reference.

TECHNICAL FIELD

The present disclosure relates to the field of semiconductor technology, and more particularly, to a semiconductor structure and a fabrication method thereof.

BACKGROUND

With the development of semiconductor structures towards integration, sizes of the semiconductor structures are getting smaller and smaller. For example, in processes of fabricating dynamic random access memory (DRAM), when a vertical gate-all-around (GAA) transistor is used as an access transistor, an area occupied by the GAA transistor may reach $4F^2$, which can increase number of memory cells per unit area and increase density of arrangement.

However, gate-induced drain leakage is prone to be formed between a gate/drain of the vertical GAA transistor, which reduces performance of the semiconductor structures.

SUMMARY

A first aspect of embodiments of the present disclosure provides a method for fabricating a semiconductor structure, which includes:
  providing a substrate;
  forming a plurality of active pillars arranged in an array in the substrate, where each of the plurality of active pillars extends along a direction perpendicular to the substrate; and
  forming a gate arranged around each of the plurality of active pillars, where a projection of the gate on a given one of the plurality of active pillars covers a channel region of the given active pillar. Along the direction perpendicular to the substrate, the gate includes a first conductive layer and a second conductive layer sequentially arranged in a stack, and a work function of the first conductive layer is different from a work function of the second conductive layer.

In some embodiments, at least one of the work function of the first conductive layer and the work function of the second conductive layer is a high work function.

In some embodiments, a material of the first conductive layer and a material of the second conductive layer both include one of TiN, TiAl, Ta, W, Wn, CO, Al and La, and the material of the first conductive layer is different from the material of the second conductive layer.

In some embodiments, the material of the first conductive layer includes one of TiN, TiAl, Ta, W, Wn, CO, Al, and La; and
  the material of the second conductive layer includes polysilicon with doped ions.

In some embodiments, the doped ions include N-type ions.

In some embodiments, the step of forming a plurality of active pillars in the substrate includes:
  forming a plurality of first grooves spaced along a first direction in the substrate, where the plurality of first grooves extend along a second direction, an area between adjacent two of the plurality of first grooves constitutes an active strip, and the first direction intersects with the second direction;
  forming a spacer in each of the plurality of first grooves, where a top surface of the spacer is flush with a top surface of the substrate;
  forming a plurality of second grooves spaced along the second direction in the substrate, where each of the plurality of second grooves extends along the first direction, a depth of a given one of the plurality of second groove is smaller than a depth of a given one of the plurality of first groove, reserved part of the active strips constitutes a plurality of initial active pillars arranged in an array, and reserved part of second spacers constitutes a plurality of isolation pillars spaced; and
  performing ion implantation on the plurality of initial active pillars to form the plurality of active pillars.

In some embodiments, a ratio of the depth of the given second groove to the depth of the given first groove is 1:3 to 1:2.

In some embodiments, the spacer includes a first spacer and the second spacer sequentially arranged in a stack, and the first spacer is arranged on the substrate.

In some embodiments, after the step of performing ion implantation on the plurality of initial active pillars and before the step of forming a gate arranged around each of the plurality of active pillars, the fabrication method further includes:
  forming a plurality of bit lines spaced along the first direction in the substrate, where each of the plurality of bit lines extends along the second direction.

In some embodiments, after the step of performing ion implantation on the plurality of initial active pillars, and before the step of forming a plurality of bit lines spaced along the first direction in the substrate, the fabrication method further includes:
  forming a protective layer respectively on a top surface of a given one of the plurality of initial active pillars and on a top surface of a given one of the plurality of isolation pillars; and
  after the forming a plurality of bit lines spaced along the first direction in the substrate, the fabrication method includes:
  removing the protective layers and the plurality of isolation pillars, the first spacer and the plurality of active pillars enclosing to form a filling region.

In some embodiments, after the step of removing the protective layer and the second spacer, the fabrication method further includes:
  forming a gate oxide layer on a sidewall of the given active pillar;
  sequentially forming a first initial insulating layer, a first initial conductive layer, a second initial conductive layer and a second initial insulating layer in the filling region, where a top surface of the second initial insulating layer is flush with the top surface of the substrate;
  forming a third groove extending along the first direction in the second initial insulating layer, where the third groove exposes the second initial conductive layer between adjacent two of the plurality of active pillars in the second direction; and removing the second initial conductive layer exposed in the third groove, the first initial conductive layer and part of the first initial insulating layer, where a reserved part of the first initial conductive layer a reserved part of the second initial conductive layer are used as the first conductive layer and the second conductive layer respectively, the first conductive layer and the second conductive layer constitute word lines, each of the word lines includes a gate around each of the plurality of active pillars and a conductive segment configured to connect each of the gates along the first direction.

In some embodiments, after the step of removing the second initial conductive layer exposed in the third groove, the fabrication method further includes:

forming a third insulating layer in an area between adjacent two of the word lines, where the third insulating layer is connected to a reserved part of the second initial insulating layer to form an isolation structure.

A second aspect of the embodiments of the present disclosure provides a semiconductor structure, which includes: a substrate;

a plurality of active pillars arranged in an array in the substrate, where each of the plurality of active pillars extend along a direction perpendicular to the substrate; and a plurality of gates, where a given one of the plurality of gates is arranged around a given one of the plurality of active pillars, and a projection of the given gate on the given active pillar covers a channel region of the given active pillar. The given gate includes a first conductive layer and a second conductive layer arranged in a stack, and a work function of the first conductive layer is different from a work function of the second conductive layer.

In some embodiments, the semiconductor structure further includes a conductive segment configured to connect each of the plurality of gates positioned in the same first direction, where the conductive segment and a given one of the plurality of gates constitute a word line, and the word line extends along the first direction.

In some embodiments, the semiconductor structure includes a plurality of bit lines, each of the plurality of bit lines extends along a second direction and connects each of the plurality of active pillars positioned in the same second direction.

In some embodiments, a material of the plurality of bit lines includes cobalt silicide.

In addition to the technical problems solved by the embodiments of the present disclosure described above, technical features constituting technical solutions and beneficial effects brought by the technical features of these technical solutions, other technical problems that can be solved by the semiconductor structure and the fabrication method thereof provided by the embodiments of the present disclosure, other technical features included in the technical solutions and beneficial effects brought by these technical features will be described in further detail in some implementations.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

FIG. 3 is a flowchart II of the method for fabricating a semiconductor structure according to an embodiment of the present disclosure;

REFERENCE NUMERALS IN THE ATTACHED DRAWINGS

10—substrate; 11—first groove; 12—second groove; 20—photoresist layer; 21—mask protrusion; 22—opening; 30—active strip; 31—initial active pillar; 32—active pillar; 321—drain region; 322—channel region; 323—source region; 40—spacer; 41—first spacer; 42—second spacer; 43—isolation pillar; 50—mask strip; 6—protective layer; 70—oxide layer; 80—bit line; 90—filling region; 100—word line; 101—gate oxide layer; 102—first initial insulating layer; 103—first initial conductive layer; 104—second initial conductive layer; 105—second initial insulating layer; 106—third groove; 107—first conductive layer; 108—second conductive layer; 110—isolation structure; 120—gate; 130—conductive segment; 140—connection pad; and 150—capacitor structure.

DETAILED DESCRIPTION

As mentioned in the background, there is a problem of gate-induced drain leakage in a semiconductor structure. Based on study, it is found that a cause for this problem is because an electric field in an overlapping region between a gate and a drain of an active pillar is larger, which may increase the gate-induced drain leakage.

In view of the above technical problem, in the embodiments of the present disclosure, by fabricating the gate into a first conductive layer and a second conductive layer having different work functions, the electric field at an interface between source and drain regions of the active pillar close to the gate can be reduced, the gate-induced drain leakage current (GIDL) effect can be greatly improved, and performance of the semiconductor structure can be improved.

To make the above objectives, features, and advantages of the embodiments of the present disclosure more apparent and lucid, the technical solutions in the embodiments of the present disclosure will be described clearly and completely below with reference to the accompanying drawings in the embodiments of the present disclosure. Apparently, the described embodiments are merely some but not all of the embodiments of the present disclosure. All other embodiments obtained by persons of ordinary skill in the art based on the embodiments of the present disclosure without creative efforts shall fall within the protection scope of the present disclosure.

This embodiment does not impose restrictions on the semiconductor structure, and an introduction will be made below by taking an example where the semiconductor structure is a dynamic random access memory (DRAM), but this embodiment is not limited thereto, and the semiconductor structure in this embodiment may be other structures.

Figure 1:
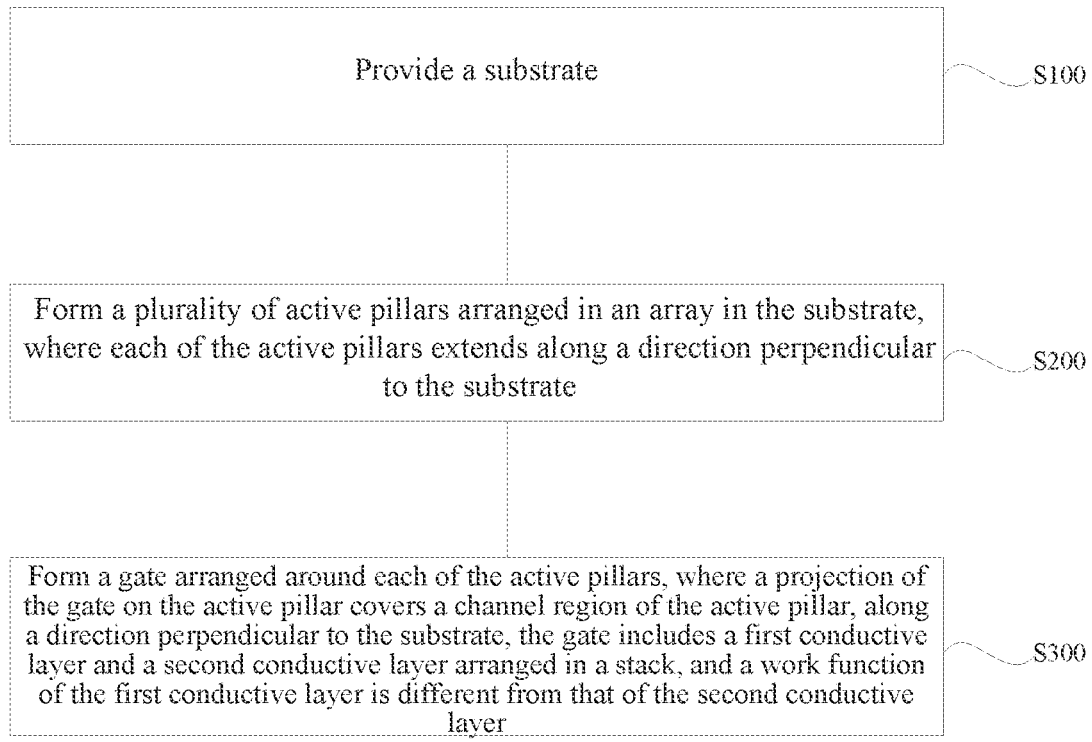
FIG. 1 is a flowchart I of a method for fabricating a semiconductor structure according to an embodiment of the present disclosure.

As shown in FIG. 1, a method for fabricating a semiconductor structure provided by an embodiment of the present disclosure includes following steps.

Step S100: providing a substrate.

Figure 2:
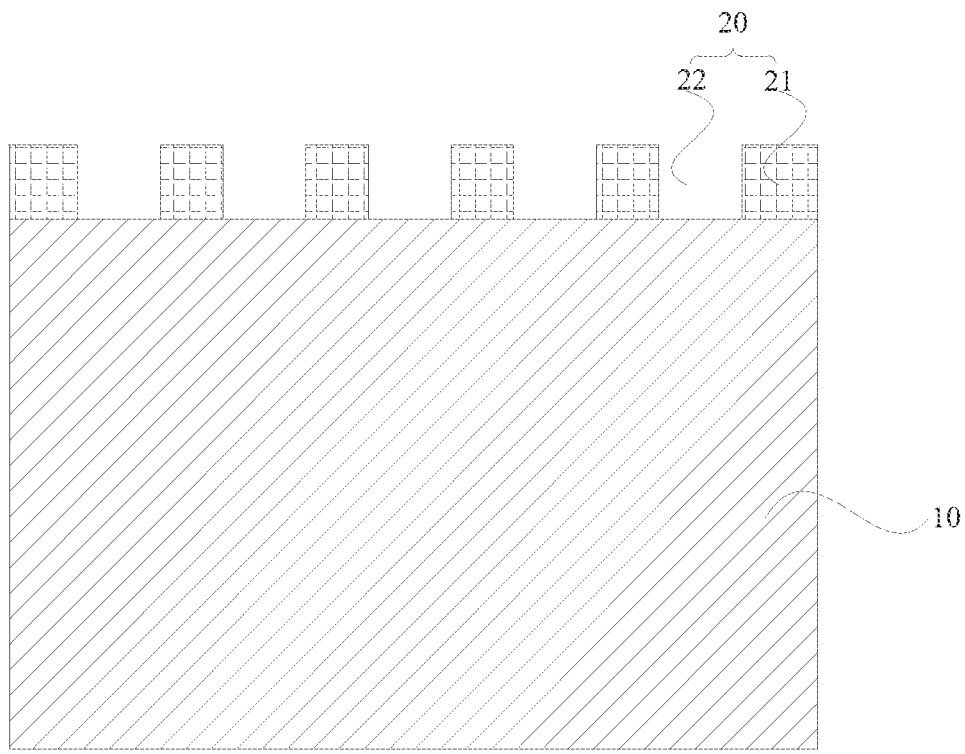
FIG. 2 is a schematic structural diagram of a substrate and a photoresist layer in the method for fabricating a semiconductor structure according to an embodiment of the present disclosure.

Exemplarily, as shown in FIG. 2, as a supporting component of the DRAM, the substrate 10 is configured to support other components provided thereon. The substrate 10 may be made from a semiconductor material, which may be one or more of silicon, germanium, silicon-germanium compounds and silicon-carbon compounds.

Step S200: forming a plurality of active pillars arranged in an array in the substrate, where each of the plurality of active pillars extends along a direction perpendicular to the substrate.

Exemplarily, as shown in FIG. 3, in Step S210, a plurality of first grooves spaced along a first direction are formed in the substrate, where the first grooves extend along a second direction, an area between adjacent first grooves constitutes an active strip, and the first direction intersects with the second direction.

Still referring to FIG. 2, a photoresist layer 20 may be formed on the substrate 10, and then the photoresist layer 20 may be patterned to form a mask pattern, where the mask pattern may include a plurality of mask protrusions 21 extending along the second direction and openings 22 between adjacent mask protrusions 21.

Figure 4:
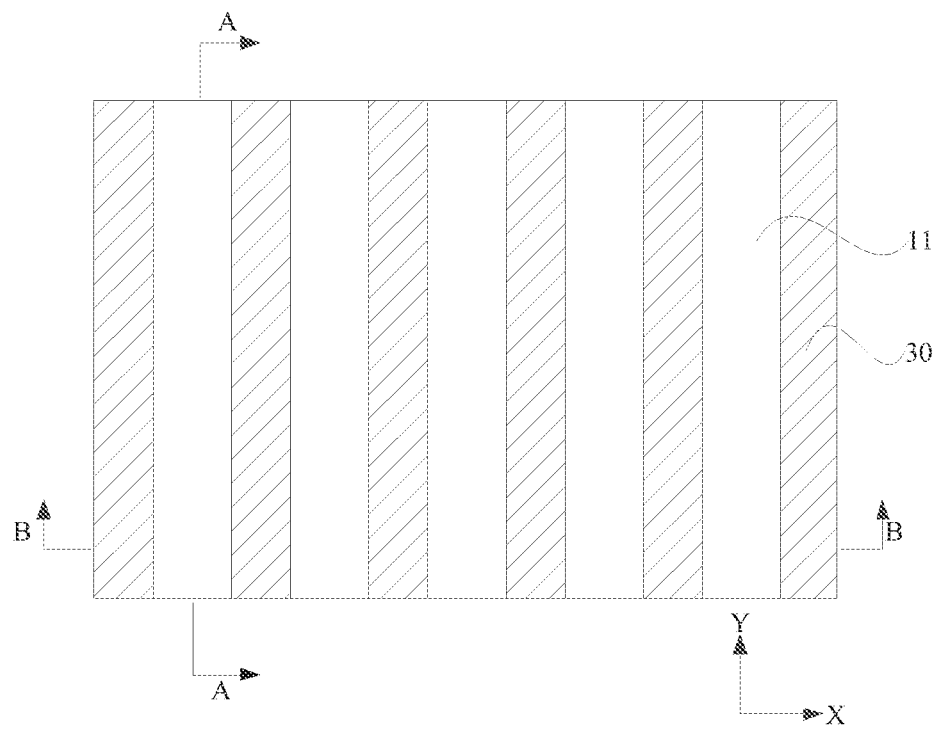
FIG. 4 is a vertical view of a first groove formed in the method for fabricating a semiconductor structure according to an embodiment of the present disclosure.
Figure 5:
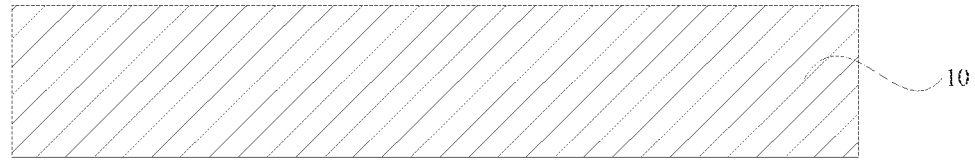
FIG. 5 is a sectional view along an A-A direction in FIG. 4.
Figure 6:
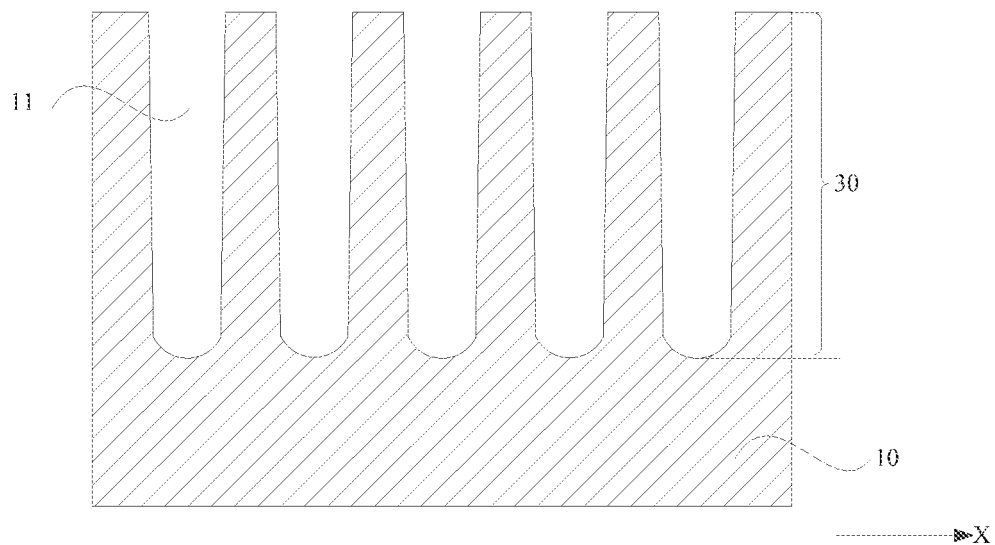
FIG. 6 is a sectional view along a B-B direction in FIG. 4.

As shown in FIGS. 4 to 6, after the openings are formed, part of the substrate 10 exposed in the openings is removed by means of an etching gas to form a plurality of first grooves 11 in the substrate 10. The plurality of first grooves 11 are arranged at intervals along the first direction, each of the plurality of first grooves 11 extends along the second direction, and an area between adjacent first grooves 11 constitute an active strip 30.

It should be noted that in this embodiment, the first direction intersects with the second direction, which may be understood that an angle between the first direction and the second direction is an acute angle, an obtuse angle or a right angle. For example, the first direction may be an X direction shown in FIG. 4, the second direction may be a Y direction shown in FIG. 4, and the first direction and the second direction are perpendicular to each other.

Step S220: forming a spacer in each of the first grooves, where a top surface of the spacer is flush with that of the substrate.

Figure 7:
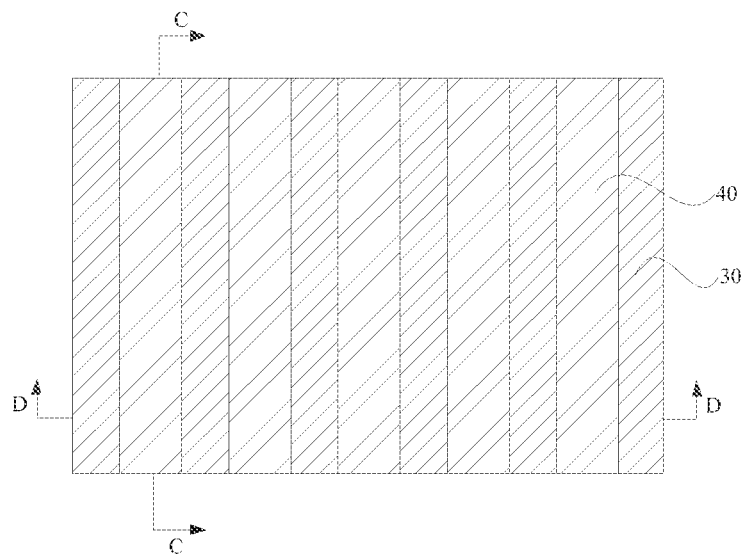
FIG. 7 is a vertical view of forming a spacer in the method for fabricating a semiconductor structure according to an embodiment of the present disclosure.
Figure 8:
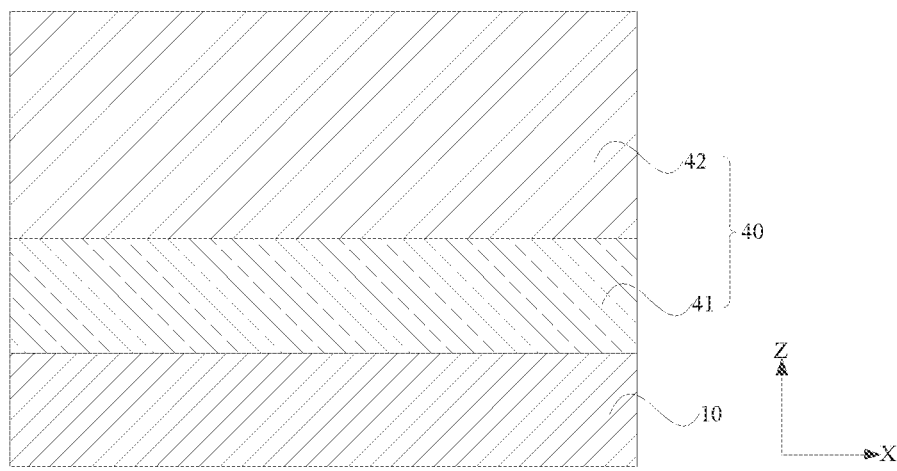
FIG. 8 is a sectional view along a C-C direction in FIG. 7.
Figure 9:
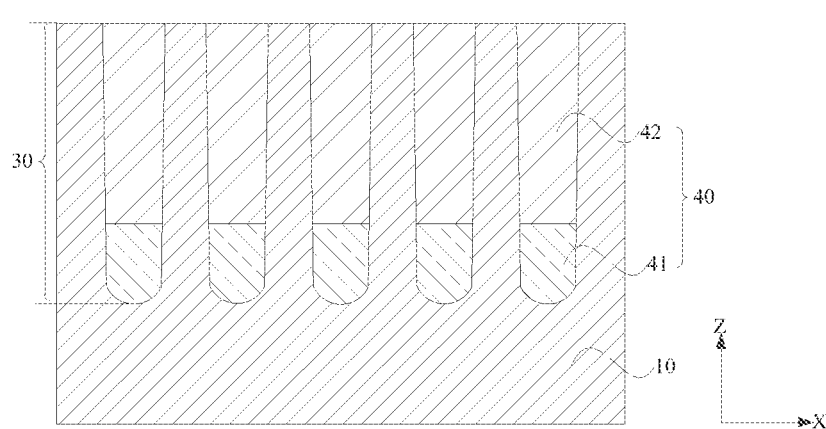
FIG. 9 is a sectional view along a D-D direction in FIG. 7.

As shown in FIGS. 7 to 9, an insulating material may be deposited in the first grooves 11 by means of a deposition process to form a spacer 40, and a top surface of the spacer 40 is flush with that of the substrate 10.

The spacer 40 may include a first spacer 41 and a second spacer 42. The first spacer 41 is arranged on the substrate 10, and the second spacer 42 is arranged on a side surface of the first spacer 41 facing away from the substrate 10, where a material of the first spacer 41 may include silicon nitride, and a material of the second spacer 42 may include silicon oxide.

In this embodiment, the spacer 40 is fabricated into a stacked structure, and an etching rate of the first spacer 41 is lower than that of the second spacer 42, such that the first spacer 41 may be used as an etching stop layer, and an etching thickness may be accurately controlled to ensure accuracy of the etching when part of the spacers are removed subsequently.

Step S230: forming a plurality of second grooves spaced along the second direction in the substrate, where each of the second grooves extends along the first direction, a depth of the second groove is smaller than that of the first groove, and reserved part of the active strips constitutes a plurality of initial active pillars arranged in an array.

Figure 10:
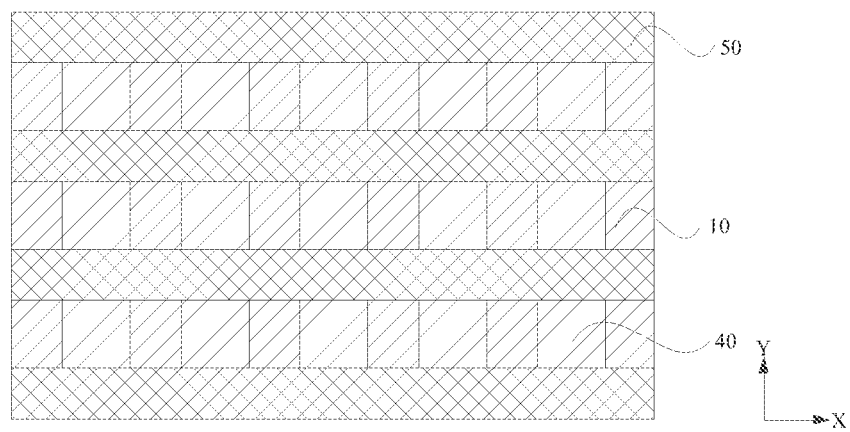
FIG. 10 is a vertical view of forming a mask strip in the method for fabricating a semiconductor structure according to an embodiment of the present disclosure.
Figure 11:
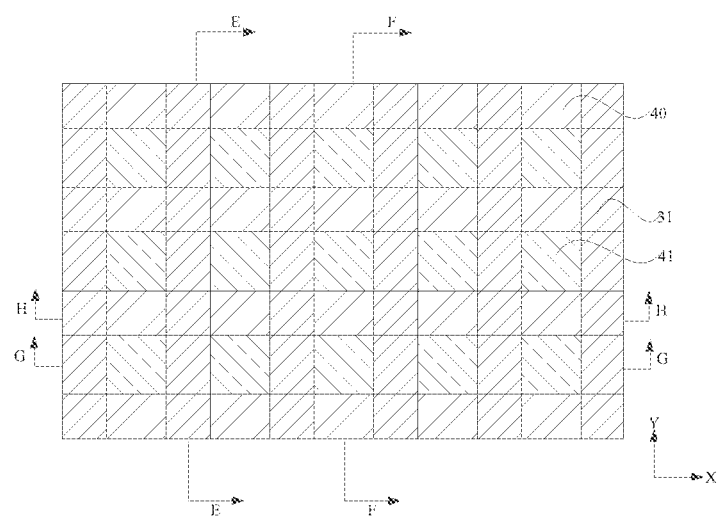
FIG. 11 is a vertical view of forming an initial active pillar in the method for fabricating a semiconductor structure according to an embodiment of the present disclosure.

Exemplarily, as shown in FIG. 10, a plurality of mask strips 50 extending along the first direction may be formed on the substrate 10, and the plurality of mask strips 50 are arranged at intervals along the second direction. The mask strip 50 may have a multilayer structure. For example, the mask strip 50 may include an oxide layer and a photoresist layer stacked up, where the oxide layer is arranged on the substrate 10.

As shown in FIGS. 11 to 14, part of the substrate 10 and the second spacer 42 between adjacent mask strips are removed to form second grooves 12 in the substrate 10. The reserved active strips 30 constitute a plurality of initial active pillars 31, the plurality of initial active pillars 31 are arranged in a matrix array, and the reserved second spacers constitute isolation pillars 43.

A ratio of the depth of the second groove 12 to the depth of the first groove 11 is 1:3 to 1:2. In this embodiment, by reasonably setting a depth ratio of the second groove 12 to the first groove 11, it is avoidable that the depth of the second groove 12 is too large and that the depth of the second grooves 12 is too small, to effectively isolate bit lines formed subsequently.

After the second grooves 12 are formed, as shown in FIGS. 12 to 15, structure layers of part of the mask strips 50 are formed on the top surfaces of the initial active pillars 31 and the top surfaces of the isolation pillars 43 to serve as the protective layers 60. For example, after the second grooves are formed, the photoresist layer in the mask strips 50 is removed, and the reserved oxide layer may serve as the protective layer 60, where the protective layer 60 may include insulating materials such as silicon oxide.

Figure 12:
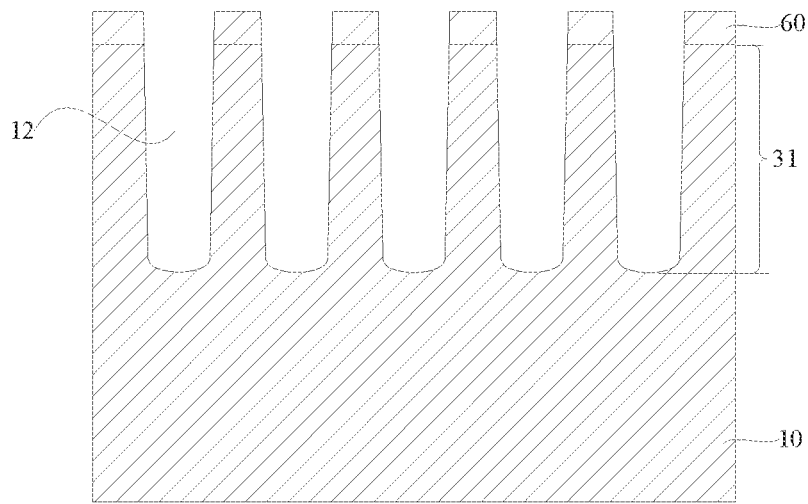
FIG. 12 is a sectional view along an E-E direction in FIG. 11.
Figure 13:
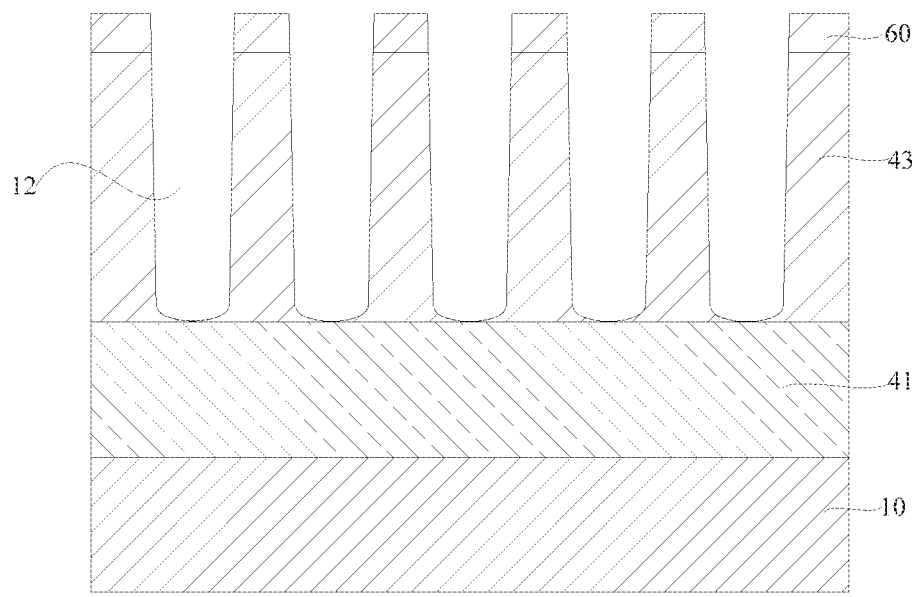
FIG. 13 is a sectional view along an F-F direction in FIG. 11.
Figure 14:
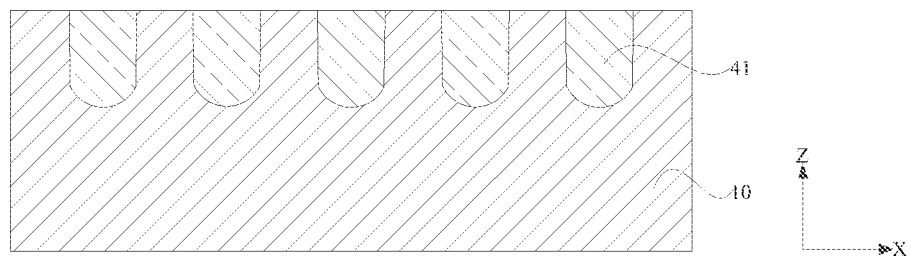
FIG. 14 is a sectional view along a G-G direction in FIG. 11.
Figure 15:
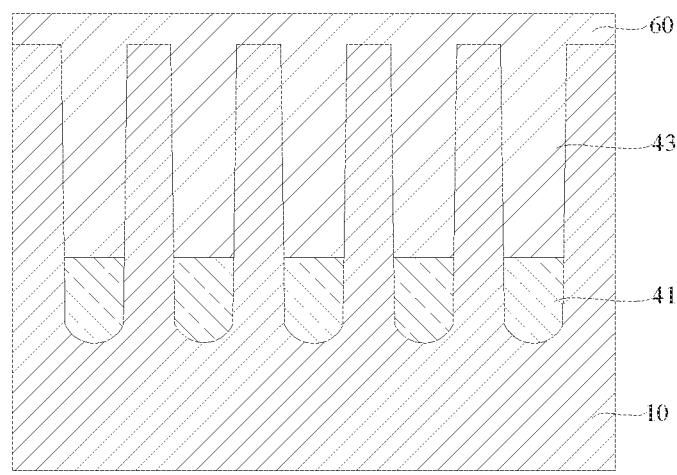
FIG. 15 is a sectional view along an H-H direction in FIG. 11.

It should be noted that FIG. 12 and FIG. 15 are diagrams showing different orientations when the protective layer 60 is formed, to facilitate the description of the position of the protective layer.

Step S240: performing ion implantation on the initial active pillars to form the active pillars.

Figure 16:
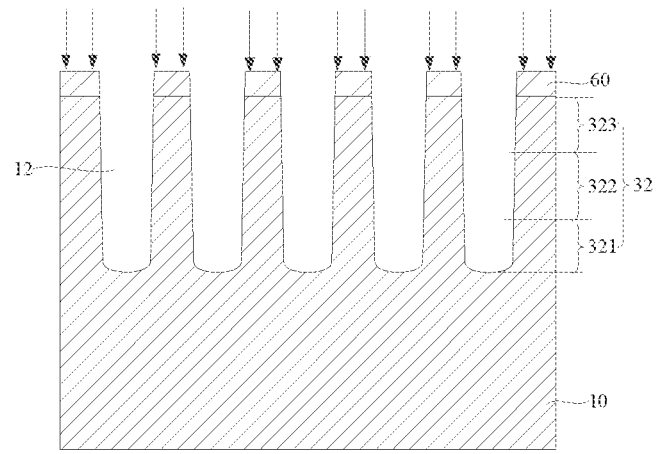
FIG. 16 is a schematic structural diagram of forming an active pillar in the method for fabricating a semiconductor structure according to an embodiment of the present disclosure.

Exemplarily, as shown in FIG. 16, ion implantation may be performed on the initial active pillars 31 by means of an ion implantation technique, to form the active pillars 32.

The procedure of forming the active pillar 32 may be carried out by three times of ion implantation processes. For example, first, a drain region 321 may be formed at the bottom of the initial active pillar 31 by controlling ion implantation energy and types of implanted dopant ions in the ion implantation processes. Next, a channel region 322 may be formed in the middle of the initial active pillar 31 by controlling ion implantation energy and types of implanted dopant ions in the ion implantation processes. Finally, a source region 323 may be formed at the top of the initial active pillar 31 by controlling ion implantation energy and types of implanted dopant ions in the ion implantation processes. The types of the dopant ions in the drain region 321 may be the same as the types of the dopant ions in the source region 323, for example, the dopant ions may include N-type ions. The types of the dopant ions in the channel region 322 may be different from the types of the dopant ions in the drain region 321, for example, the dopant ions may include P-type ions.

In this embodiment, the protective layers are arranged on the top surfaces of the initial active pillars and the top surfaces of the isolation pillars, such that the top surfaces of the initial active pillars can be protected to prevent the initial active pillars from being damaged in the procedure of ion implantation. In this way, the performance of the semiconductor structure may be improved.

Figure 17:
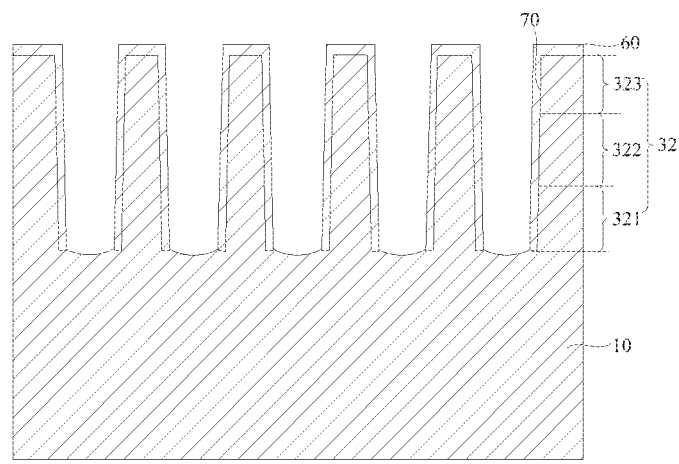
FIG. 17 is a schematic structural diagram of forming an oxide layer in the method for fabricating a semiconductor structure according to an embodiment of the present disclosure.

As shown in FIG. 17, after the active pillar 32 is formed, an oxide layer 70 may be formed on a sidewall of the second groove 12 by means of an atomic layer deposition process, where the oxide layer 70 may be integrated with the protective layer 60 into a whole.

Exemplarily, an initial oxide layer may be formed on the sidewall and a bottom wall of the second groove 12 by means of an atomic layer deposition process. Next, the initial oxide layer on the bottom wall of the second groove 12 is removed by means of an etching gas or an etching liquid, and the initial oxide layer reserved on the sidewall of the second groove 12 constitutes the oxide layer 70.

In this embodiment, the protective layer and the oxide layer are arranged to protect the side surface of the top surface of the active pillar, thereby preventing the active pillar from being damaged during subsequent formation of the bit lines, and thus improving the performance of the semiconductor structure.

In some embodiments, after the step of performing ion implantation on the initial active pillar, the method for fabricating a semiconductor structure further includes: forming a plurality of bit lines 80 spaced along the first direction in the substrate 10, where each of the bit lines 80 extends along the second direction.

Figure 18:
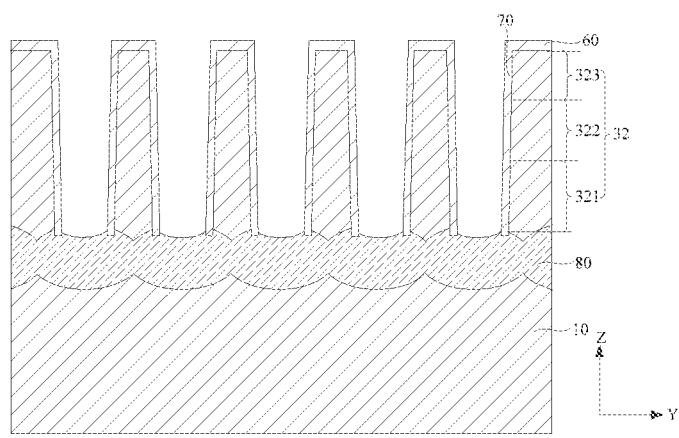
FIG. 18 is a schematic structural diagram I of forming a bit line in the method for fabricating a semiconductor structure according to an embodiment of the present disclosure.
Figure 19:
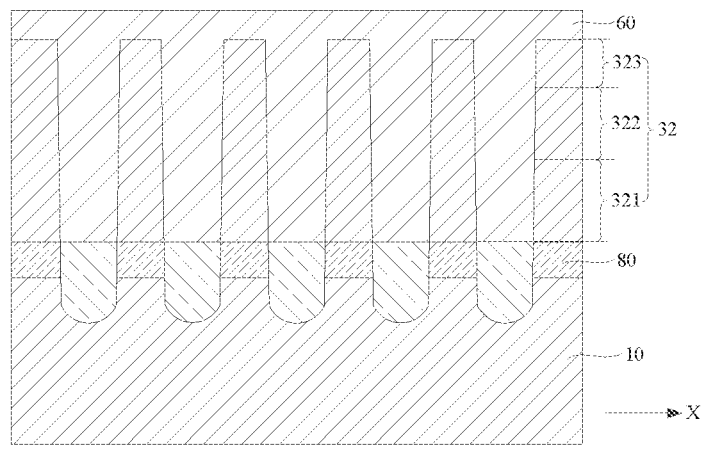
FIG. 19 is a schematic structural diagram II of forming a bit line in the method for fabricating a semiconductor structure according to an embodiment of the present disclosure.

As shown in FIG. 18 and FIG. 19, cobalt is introduced into the area surrounded by the oxide layer 70 by means of ion implantation, such that the cobalt reacts with silicon in the substrate 10 under certain conditions to form cobalt silicide, and the cobalt silicide layer forms the bit lines 80.

In some embodiments, after the step of forming a plurality of bit lines spaced along the first direction in the substrate, the method for fabricating a semiconductor structure further includes following steps.

Figure 20:
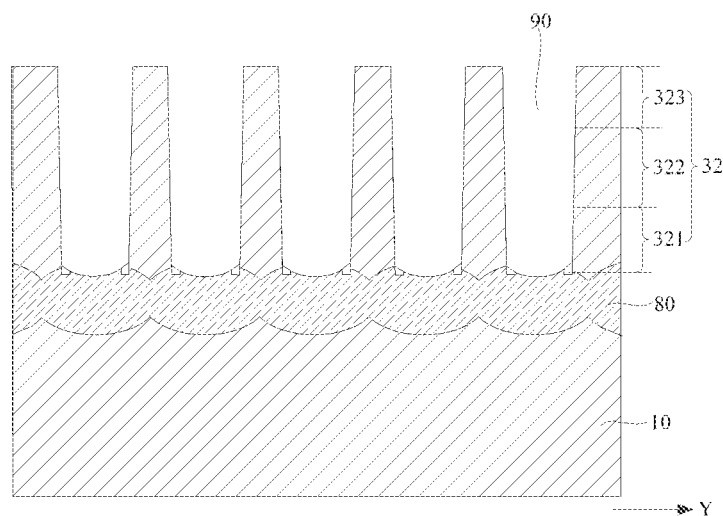
FIG. 20 is a schematic structural diagram I of removing a protective layer, an oxide layer and a second spacer in the method for fabricating a semiconductor structure according to an embodiment of the present disclosure.
Figure 21:
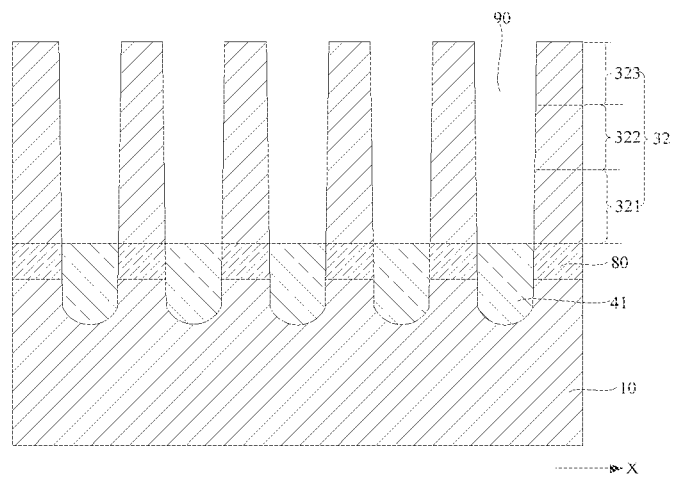
FIG. 21 is a schematic structural diagram II of removing a protective layer, an oxide layer and a second spacer in the method for fabricating a semiconductor structure according to an embodiment of the present disclosure.

As shown in FIG. 20 and FIG. 21, the protective layer 60, the oxide layer 70 and the isolation pillars 43 may be removed by means of an etching gas or an etching liquid, and the first spacer 41 and a plurality of active pillars 32 enclose a filling region 90.

Step S300: forming a gate arranged around each of the active pillars, where a projection of the gate on the active pillar covers a channel region of the active pillar, the gate includes a first conductive layer and a second conductive layer arranged in a stack, and a work function of the first conductive layer is different from that of the second conductive layer.

Figure 22:
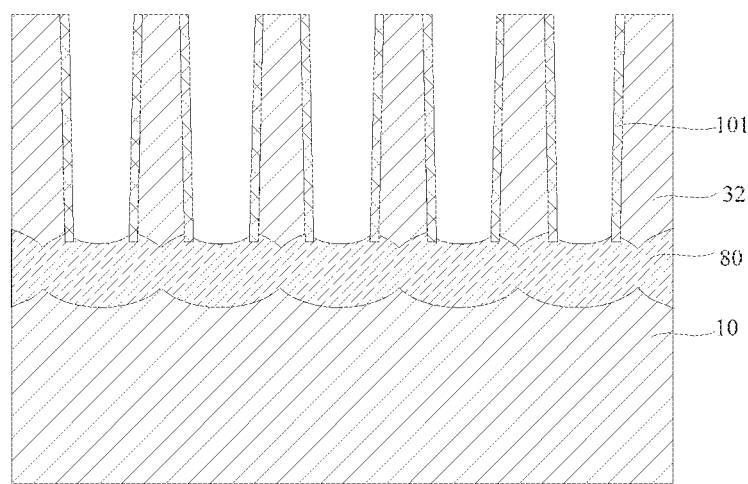
FIG. 22 is a schematic structural diagram I of forming a gate oxide layer in the method for fabricating a semiconductor structure according to an embodiment of the present disclosure.
Figure 23:
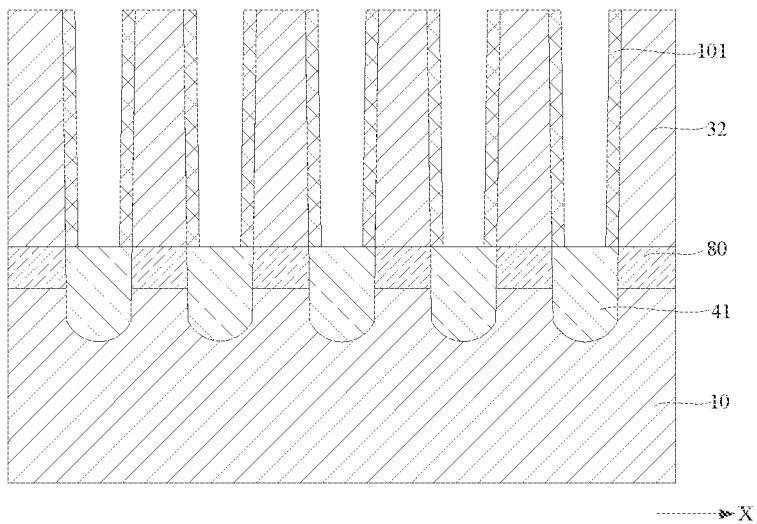
FIG. 23 is a schematic structural diagram II of forming the oxide layer in the method for fabricating a semiconductor structure according to an embodiment of the present disclosure.

Exemplarily, as shown in FIG. 22 and FIG. 23, a gate oxide layer 101 may be formed on the sidewall of the active pillar 32. For example, an initial gate oxide layer may be formed on the top surface and the sidewall of the active pillar 32 and the bottom wall of the filling region by means of an atomic layer deposition process, and then the initial gate oxide layer on the top surface of the active pillar 32 and the initial gate oxide layer on the bottom wall of the filling region 90 are removed, and the initial gate oxide layer reserved on the sidewall of the active pillar 32 constitutes the gate oxide layer 101.

Figure 24:
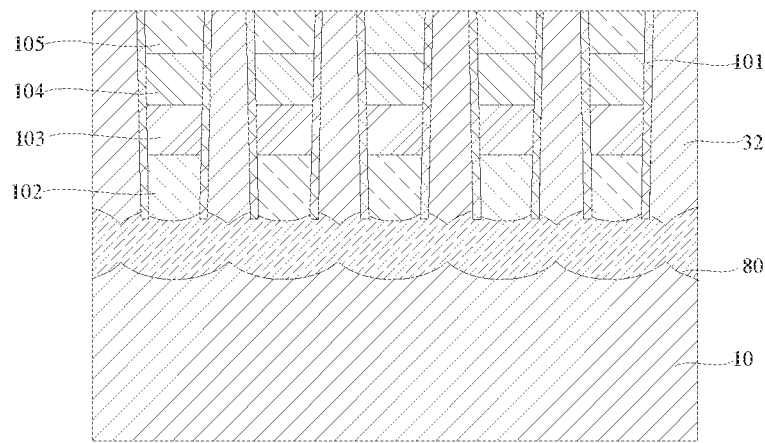
FIG. 24 is a schematic structural diagram I of forming a first initial insulating layer, a first initial conductive layer, a second initial conductive layer and a second initial insulating layer in the method for fabricating a semiconductor structure according to an embodiment of the present disclosure.
Figure 25:
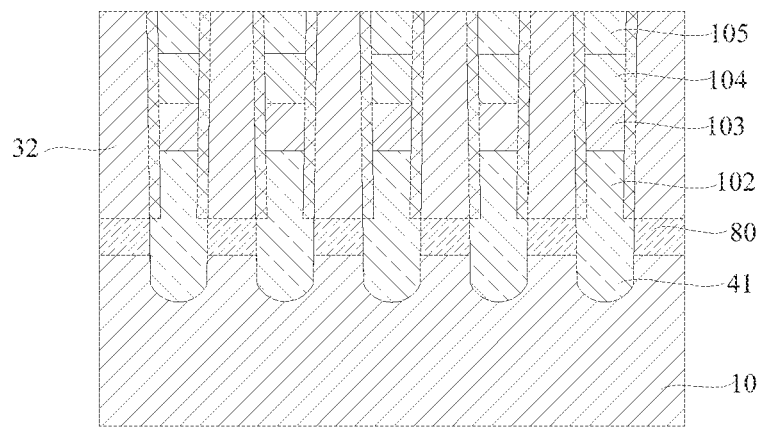
FIG. 25 is a schematic structural diagram II of forming the first initial insulating layer, the first initial conductive layer, the second initial conductive layer and the second initial insulating layer in the method for fabricating a semiconductor structure according to an embodiment of the present disclosure.

As shown in FIG. 24 and FIG. 25, a first initial insulating layer 102, a first initial conductive layer 103, a second initial conductive layer 104 and a second initial insulating layer 105 stacked up are sequentially formed in the filling region 90, where a top surface of the second initial insulating layer 105 is flush with that of the substrate 10.

Figure 26:
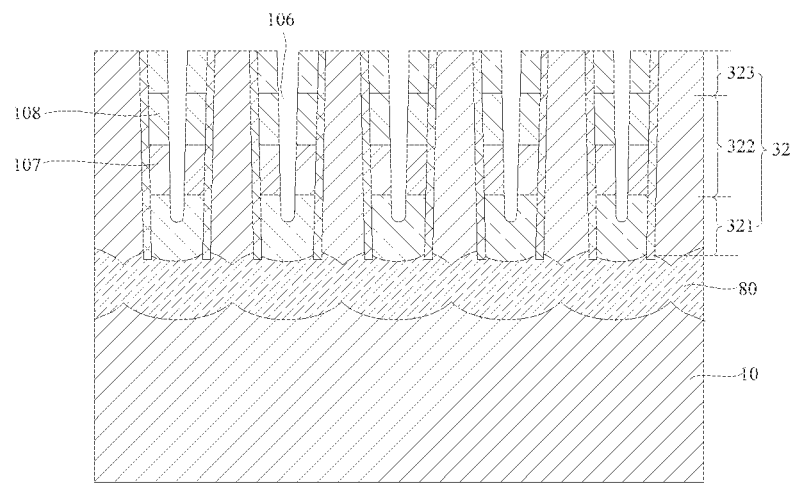
FIG. 26 is a schematic structural diagram of forming a third groove in the method for fabricating a semiconductor structure according to an embodiment of the present disclosure.

As shown in FIG. 26, a third groove 106 extending along the first direction is formed in the second initial insulating layer 105, and the third groove 106 exposes the second initial conductive layer 104 between adjacent active pillars 32 along the second direction.

The second initial conductive layer 104, the first initial conductive layer 103 and part of the first initial insulating layer 102 exposed in the third groove 106 are removed. The reserved first initial conductive layer 103 constitutes the first conductive layer 107, the reserved second initial conductive layer 104 constitutes the second conductive layer 108, and the first conductive layer 107 and the second conductive layer 108 constitute word lines 100. Each of the word lines 100 includes gates 120 surrounding each of the active pillars and a conductive segment 130 configured to connect each of the gates 120 along the first direction.

It should be understood that portions of the first conductive layer and the second conductive layer surrounding the active pillars constitute the gates, and the first conductive layer and the second conductive layer positioned between the gates in the same direction constitute the conductive segments.

In this embodiment, the work function of the first conductive layer is different from that of the second conductive layer. In this embodiment, by fabricating the gate into the first conductive layer and the second conductive layer having different work functions, the electric field at the interface between the source and drain regions of the active pillar near the gate is reduced, the gate-induced drain leakage (GIDL) effect is greatly improved, and the performance of the semiconductor structure is improved.

It should be noted that in this embodiment, the work function of the first conductive layer is different from that of the second conductive layer. It may be understood that the work function of the first conductive layer 107 and the work function of the second conductive layer 108 are low work functions, or the work function of the first conductive layer 107 and the work function of the second conductive layer 108 are high work functions, or one of the first conductive layer 107 and the second conductive layer 108 has a high work function, and the other one has a low work function.

Exemplarily, at least one of the work function of the first conductive layer 107 and the work function of the second conductive layer 108 is a high work function. For example, the work function of the first conductive layer 107 and the work function of the second conductive layer 108 are high work functions. Exemplarily, a material of the first conductive layer 107 and a material of the second conductive layer 108 both include one of TiN, TiAl, Ta, W, Wn, CO, Al and La, and the material of the first conductive layer 107 is different from the material of the second conductive layer 108. Exemplarily, the material of the first conductive layer 107 is TiN, and the material of the second conductive layer 108 may be a material other than TiN, such as TiAl.

In this embodiment, the work function of the first conductive layer 107 and the work function of the second conductive layer 108 are both high work functions. Because the first conductive layer 107 and the second conductive layer 108 having high work functions are less sensitive to electrons in the channel region, it is difficult for the electrons in the channel region to move to the source and the drain, which reduces the electric field at the interface between the source and drain regions of the active pillar near the gate, thereby greatly improving the gate-induced drain leakage (GIDL) effect and improving the performance of the semiconductor structure.

In some embodiments, the work function of the first conductive layer 107 may be a high work function, and the work function of the second conductive layer 108 may be a low work function. For example, the material of the first conductive layer 107 includes one of TIN, TiAl, Ta, W, Wn, CO, Al, and La; and the material of the second conductive layer 108 includes polysilicon with doped ions, where the doped ions are N-type ions.

In this embodiment, the first conductive layer is arranged to reduce the electric field at the interface between the source and drain regions of the active pillar near the gate, which greatly improves the gate-induced drain leakage (GIDL). Furthermore, because the second conductive layer has a lower work function, it is easier for the second conductive layer to drive the electrons in the gate-drain overlapping region to move to the channel region, thus reducing intensity of the electric field in the gate-drain overlapping region, thereby providing a guarantee for greatly improving the GIDL.

Figure 27:
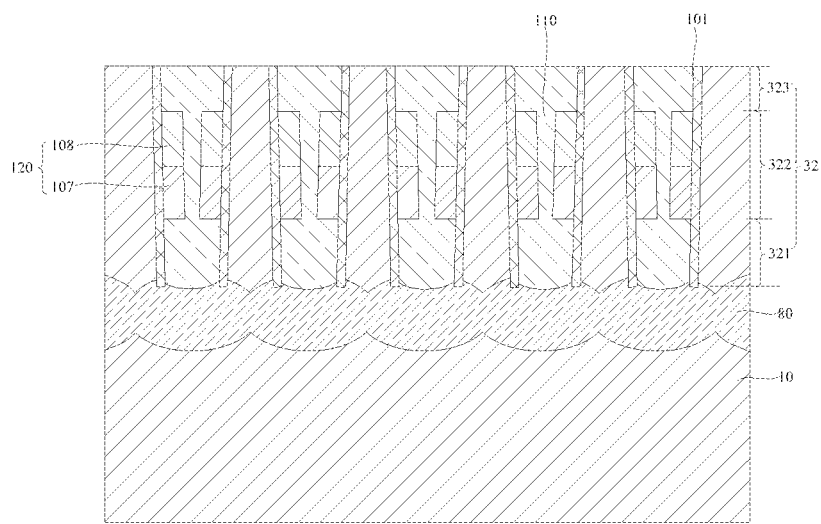
FIG. 27 is a schematic structural diagram of forming a word line in the method for fabricating a semiconductor structure according to an embodiment of the present disclosure.

In some embodiments, still referring to FIG. 27, a third insulating layer is formed in a region between adjacent word lines 100, where the third insulating layer is connected to a remaining part of the second initial insulating layer to form the isolation structure 110.

Figure 29:
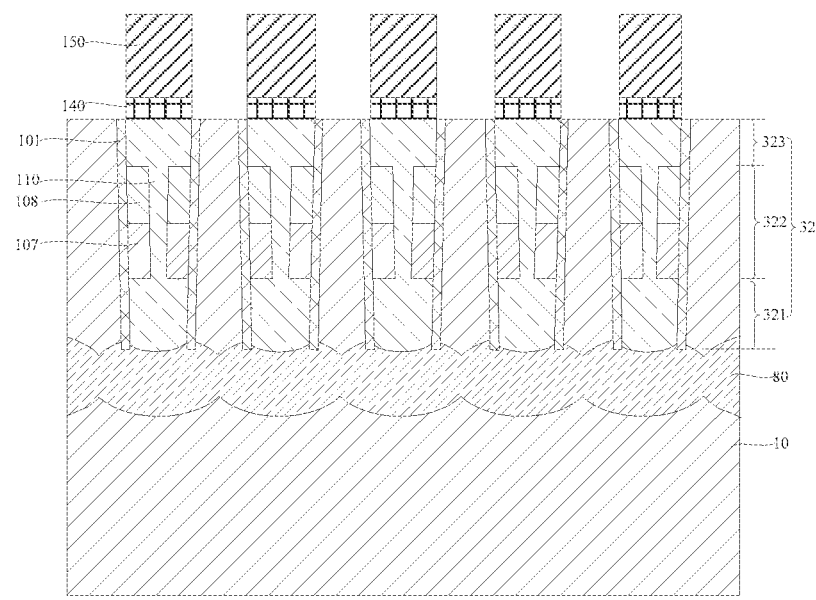
FIG. 29 is a schematic structural diagram of forming a connection pad and a capacitor structure in the method for fabricating a semiconductor structure according to an embodiment of the present disclosure.

In some embodiments, as shown in FIG. 29, after the isolation structure 110 is formed, a connection pad 140 and a capacitor structure 150 may be sequentially formed on the isolation structure 110, where procedures of fabricating the connection pad 140 and the capacitor structure 150 are the same as those of the prior art, and thus details thereof are omitted in this embodiment.

The embodiments of the present disclosure also provide a semiconductor structure, which includes a substrate 10, a plurality of active pillars 32, and a plurality of gates 120.

The plurality of active pillars 32 are arranged in an array in the substrate 10, each of the active pillars 32 extends along a direction perpendicular to the substrate 10. Each of the gates 120 is arranged around one active pillar 32, a projection of the gate 120 on the active pillar 32 covers a channel region 322 of the active pillar 32, where the gate 120 includes a first conductive layer 107 and a second conductive layer 108 arranged in a stack, and a work function of the first conductive layer 107 is different from that of the second conductive layer 108.

In this embodiment, the gate is fabricated into the first conductive layer and the second conductive layer having different work functions, to reduce the electric field at the interface between the source and drain regions of the active pillar near the gate, there greatly improving the GIDL effect and improving the performance of the semiconductor structure.

Figure 28:
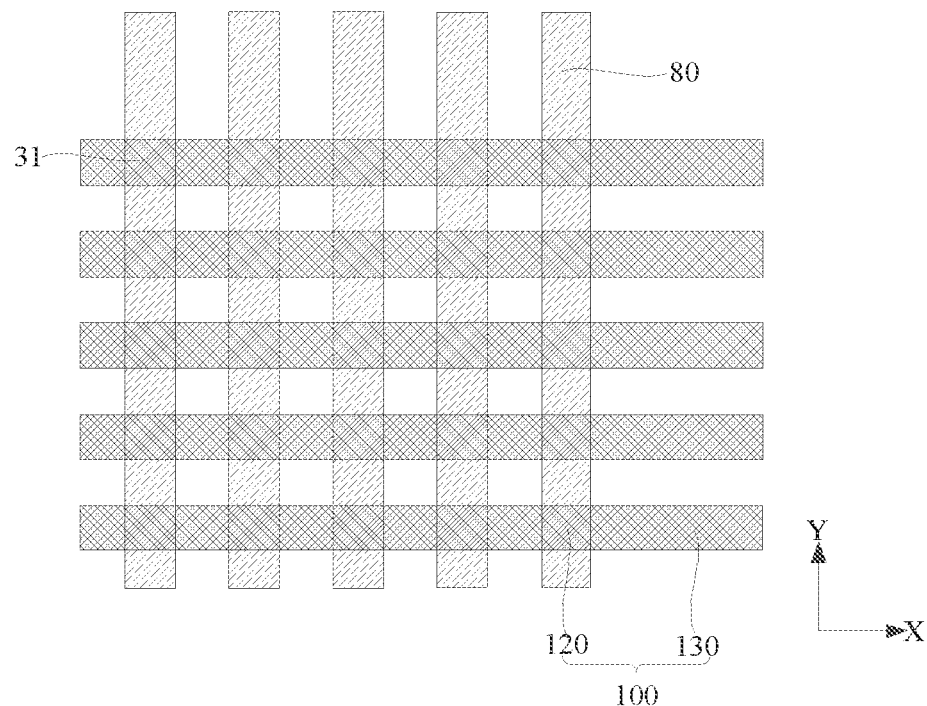
FIG. 28 is a vertical view of FIG. 27.

Further, as shown in FIG. 28, the semiconductor structure further includes a conductive segment 130 configured to connect each of the gates 120 positioned in the same first direction, where the conductive segment 130 and the gate 120 constitute one word line 100, and the word line 100 extends along the first direction.

The conductive segment 130 also includes the first conductive layer and the second conductive layer arranged in a stack, and the conductive segment 130 and the gate 120 are fabricated in the same process.

It should be noted that, in this embodiment, the gates in the same first direction may be understood as the gates in the same first direction connected to the conductive segment.

In some embodiments, the semiconductor structure includes a plurality of bit lines 80, where each of the bit lines 80 extends along the second direction and connects to each of the active pillars positioned in the same second direction. For example, each of the bit lines 80 connects the drain region of each of the active pillars positioned in the same column, where a material of the bit lines 80 includes cobalt silicide.

The embodiments or the implementation manners in this specification are described in a progressive manner. Each of the embodiments is focused on difference from other embodiments, and cross reference is available for identical or similar parts among different embodiments.

In the descriptions of this specification, descriptions of reference terms "one embodiment", "some embodiments", "an exemplary embodiment", "an example", "one example", or "some examples" are intended to indicate that features, structures, materials, or characteristics described with reference to the embodiment or example are included in at least one embodiment or example of the present disclosure.

The schematic representation of the above terms throughout this specification does not necessarily refer to the same embodiment or example. Furthermore, the features, structures, materials, or characteristics set forth may be combined in any suitable manner in one or more embodiments or examples.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:
providing a substrate;
forming a plurality of active pillars arranged in an array in the substrate, each of the plurality of active pillars extending along a direction perpendicular to the substrate; wherein the forming a plurality of active pillars arranged in an array in the substrate comprises:
forming a plurality of first grooves spaced along a first direction in the substrate, the plurality of first grooves extending along a second direction, an area between adjacent two of the plurality of first grooves constituting an active strip, and the first direction intersecting with the second direction;
forming a spacer in each of the plurality of first grooves, a top surface of the spacer being flush with a top surface of the substrate; wherein the spacer comprises a first spacer and the second spacer sequentially arranged in a stack, and the first spacer is arranged on the substrate;
forming a plurality of second grooves spaced along the second direction in the substrate, each of the plurality of second grooves extending along the first direction, a depth of a given one of the plurality of second groove being smaller than a depth of a given one of the plurality of first groove, reserved part of the active strips constituting a plurality of initial active pillars arranged in an array, and reserved part of second spacers constituting a plurality of isolation pillars spaced; and
performing ion implantation on the plurality of initial active pillars to form the plurality of active pillars;
forming a protective layer respectively on a top surface of a given one of the plurality of initial active pillars and on a top surface of a given one of the plurality of isolation pillars;
forming a plurality of bit lines spaced along the first direction in the substrate, each of the plurality of bit lines extending along the second direction;
removing the protective layers and the plurality of isolation pillars, the first spacer and the plurality of active pillars enclosing to form a filling region; and
forming a gate arranged around each of the plurality of active pillars, a projection of the gate on a given one of the plurality of active pillars covering a channel region of the given active pillar, wherein along the direction perpendicular to the substrate, the gate comprises a first conductive layer and a second conductive layer sequentially arranged in a stack, and a work function of the first conductive layer being different from a work function of the second conductive layer; wherein the forming a gate arranged around each of the plurality of active pillars comprises:
forming a gate oxide layer on a sidewall of the given active pillar;
sequentially forming a first initial insulating layer, a first initial conductive layer, a second initial conductive layer and a second initial insulating layer in the filling region, a top surface of the second initial insulating layer being flush with the top surface of the substrate;
forming a third groove extending along the first direction in the second initial insulating layer, the third groove exposing the second initial conductive layer between adjacent two of the plurality of active pillars in the second direction; and
removing the second initial conductive layer exposed in the third groove, the first initial conductive layer and part of the first initial insulating layer, a reserved part of the first initial conductive layer and a reserved part of the second initial conductive layer being used as the first conductive layer and the second conductive layer respectively, and the first conductive layer and the second conductive layer constituting word lines, each of the word lines comprising a gate around each of the plurality of active pillars and a conductive segment configured to connect each of the gates along the first direction.

2. The method for fabricating a semiconductor structure according to claim 1, wherein at least one of the work function of the first conductive layer and the work function of the second conductive layer is a high work function.

3. The method for fabricating a semiconductor structure according to claim 2, wherein a material of the first conductive layer and a material of the second conductive layer both comprise one of TiN, TiAl, Ta, W, WN, Co, Al and La, and the material of the first conductive layer is different from the material of the second conductive layer.

4. The method for fabricating a semiconductor structure according to claim 2, wherein the material of the first conductive layer comprises one of TiN, TiAl, Ta, W, WN, Co, Al, and La; and the material of the second conductive layer comprises polysilicon with doped ions.

5. The method for fabricating a semiconductor structure according to claim 4, wherein the doped ions comprise N-type ions.

6. The method for fabricating a semiconductor structure according to claim 1, wherein a ratio of the depth of the given second groove to the depth of the given first groove is 1:3 to 1:2.

7. The method for fabricating a semiconductor structure according to claim 1, wherein after the removing the second initial conductive layer exposed in the third groove, the method further comprises:

forming a third insulating layer in an area between adjacent two of the word lines, the third insulating layer being connected to a reserved part of the second initial insulating layer to form an isolation structure.

* * * * *